(12) United States Patent
Kim et al.

(10) Patent No.: US 10,714,453 B2
(45) Date of Patent: Jul. 14, 2020

(54) SEMICONDUCTOR PACKAGE INCLUDING SEMICONDUCTOR CHIP

(71) Applicant: SAMSUNG ELECTRONICS CO., LTD., Suwon-si, Gyeonggi-do (KR)

(72) Inventors: Doo Jin Kim, Hwaseong-si (KR); Young Sik Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 257 days.

(21) Appl. No.: 15/995,176

(22) Filed: Jun. 1, 2018

(65) Prior Publication Data

US 2019/0244932 A1  Aug. 8, 2019

(30) Foreign Application Priority Data

Feb. 8, 2018  (KR) .......................... 10-2018-0015626

(51) Int. Cl.
*H01L 25/065* (2006.01)
*H01L 23/498* (2006.01)
*H01L 23/538* (2006.01)

(52) U.S. Cl.
CPC .... *H01L 25/0657* (2013.01); *H01L 23/49816* (2013.01); *H01L 23/5385* (2013.01)

(58) Field of Classification Search
None
See application file for complete search history.

(56) References Cited

U.S. PATENT DOCUMENTS

| | | | |
|---|---|---|---|
| 7,944,036 B2 | 5/2011 | Sasaki | |
| 8,426,951 B2 | 4/2013 | Han | |
| 8,513,740 B2 | 8/2013 | Park et al. | |
| 8,648,429 B2 | 2/2014 | Kang et al. | |
| 8,659,136 B2 | 2/2014 | Youn et al. | |
| 8,674,494 B2 | 3/2014 | Nam et al. | |
| 8,698,300 B2 | 4/2014 | Ko | |
| 9,412,720 B2 | 8/2016 | Nam et al. | |
| 9,747,959 B2 | 8/2017 | Seo | |
| 9,812,449 B2 | 11/2017 | Obradovic et al. | |
| 9,831,323 B2 | 11/2017 | Kittl et al. | |
| 9,859,321 B2 | 1/2018 | Kim et al. | |
| 2012/0280404 A1 | 11/2012 | Kwon et al. | |
| 2013/0154074 A1 | 6/2013 | Oh | |
| 2014/0335657 A1 | 11/2014 | Kwon et al. | |

(Continued)

FOREIGN PATENT DOCUMENTS

JP 4913640 B 1/2012
KR 10-07776130 B1 11/2007

(Continued)

*Primary Examiner* — Bo B Jang
(74) *Attorney, Agent, or Firm* — Volentine, Whitt & Francos, PLLC (57) ABSTRACT

A semiconductor package includes a first semiconductor chip disposed on a substrate. A first upward pad is disposed on an upper surface of the first semiconductor chip. A second semiconductor chip is arranged with an offset above the first semiconductor chip. A first downward pad is disposed on a lower surface of the second semiconductor chip. A first bonding wire connects the first upward pad and the substrate. A first inter-chip connector is interposed between the first upward pad and the first downward pad. A side surface of the second semiconductor chip is arranged above the first upward pad.

22 Claims, 6 Drawing Sheets

(56) References Cited

U.S. PATENT DOCUMENTS

| | | |
|---|---|---|
| 2015/0115438 A1 | 4/2015 | Lee et al. |
| 2016/0086921 A1* | 3/2016 | Cho .................. H01L 25/50 |
| | | 257/737 |
| 2016/0133312 A1 | 5/2016 | Lee et al. |
| 2017/0040455 A1 | 2/2017 | Kittl et al. |
| 2017/0098661 A1 | 4/2017 | Rakshit et al. |

FOREIGN PATENT DOCUMENTS

| | | |
|---|---|---|
| KR | 2011-0020547 A | 3/2011 |
| KR | 10-1740483 B1 | 11/2012 |
| KR | 2013-0024567 A | 3/2013 |
| KR | 2015-0048531 A | 5/2015 |
| KR | 2016-0051471 A | 5/2016 |
| KR | 2016-0056043 A | 5/2016 |
| KR | 10-1656443 B1 | 9/2016 |
| KR | 10-1668444 B1 | 10/2016 |
| KR | 10-1696065 B1 | 1/2017 |
| KR | 2017-0000025 A | 1/2017 |
| KR | 10-1703747 B1 | 2/2017 |
| KR | 2017-0016271 A | 2/2017 |
| KR | 2017-0040086 A | 4/2017 |
| KR | 2017-0040696 A | 4/2017 |
| KR | 2017-0050019 A | 5/2017 |
| KR | 2017-0059378 A | 5/2017 |
| KR | 2017-0061275 A | 6/2017 |
| KR | 10-1766725 B1 | 8/2017 |
| KR | 10-1768960 B1 | 8/2017 |
| KR | 2017-0094026 A | 8/2017 |
| KR | 2017-0106172 A | 9/2017 |

* cited by examiner

SEMICONDUCTOR PACKAGE INCLUDING SEMICONDUCTOR CHIP

PRIORITY STATEMENT

This U.S. non-provisional patent application claims priority under 35 U.S.C. § 119 to and the benefit of Korean Patent Application No. 10-2018-0015626, filed on Feb. 8, 2018, in the Korean Intellectual Property Office (KIPO), the disclosure of which is hereby incorporated by reference in its entirety.

BACKGROUND

1. Field

The present inventive concept relates to a semiconductor package including semiconductor chips in a stacked structure.

2. Discussion of Related Art

Various studies are being conducted to include a larger capacity of memory in a smaller semiconductor device and to operate the semiconductor device more rapidly. A method of reducing a size of a semiconductor package and increasing an operating speed by stacking a plurality of semiconductor chips on a substrate has been proposed. There are several difficulties in stacking the plurality of semiconductor chips in the semiconductor package and electrically connecting the semiconductor chips.

SUMMARY

According to of the present inventive concept there is provided a semiconductor package including a printed circuit board, semiconductor chips stacked one on another on the printed circuit board such that the uppermost one of the semiconductor chips is disposed on a lower one of the semiconductor chips in the stack, bonding wires electrically connecting the semiconductor chips to the printed circuit board, and an encapsulant encapsulating the semiconductor chips and the bonding wires on the printed circuit board. The lower one of the semiconductor chips has an upper surface and an upward electrical connector disposed at the upper surface. The upward electrical connector has a first region, a second region and a third region of electrically conductive material integral with one another, the second region extending between and connecting the first and third regions. The uppermost one of the semiconductor chips of the semiconductor package has an upper surface, a side surface, a bottom surface and a downward pad of electrically conductive material at the bottom surface. A lower edge of the side surface of the uppermost one of the semiconductor chips overlies the second region of the upward electrical connector of the lower one of the semiconductor chips, and the downward pad faces and is electrically connected to the upward electrical connector of the lower semiconductor chip at the third region of the upward electrical connector. Furthermore, one of the bonding wires is electrically connected to the upward electrical connector of the lower one of the semiconductor chips at the first region of the upward electrical connector. Thus, the uppermost one of the semiconductor chips is electrically connected to the printed circuit board through the upward electrical connector of the lower one of the semiconductor chips and said one of the bonding wires.

According to of the present inventive concept there is also provided a semiconductor package including a package substrate, a first semiconductor chip on the package substrate, the first semiconductor chip having an upper surface and a first upward pad disposed on the upper surface of the first semiconductor chip, a second semiconductor chip disposed on the first semiconductor chip as laterally offset relative to the second semiconductor chip, the second semiconductor chip having a lower surface and a first downward pad disposed on the lower surface of the second semiconductor chip, a first bonding wire extending between and electrically connecting the first upward pad and the package substrate, and a first inter-chip connector interposed between the first upward pad and the first downward pad. A side surface of the second semiconductor chip overlies the first upward pad.

According to of the present inventive concept there is also provided a semiconductor package including a package substrate, a first semiconductor chip on the package substrate, a second semiconductor chip disposed on and laterally offset relative to the first semiconductor chip, a third semiconductor chip disposed on the second semiconductor chip, and a fourth semiconductor chip disposed on and laterally offset relative to the third semiconductor chip. A side surface of the third semiconductor chip is substantially coplanar with a side surface of the second semiconductor chip.

According to of the present inventive concept there is also provided a semiconductor package including a package substrate, a first semiconductor chip on the package substrate, the first semiconductor chip having an upper surface and a first upward pad disposed on the upper surface of the first semiconductor chip, a second semiconductor chip disposed on and laterally offset relative to the first semiconductor chip, the second semiconductor chip having a lower surface and a first downward pad disposed on the lower surface of the second semiconductor chip, and a first bonding wire extending between and electrically connecting the first upward pad and the package substrate. The first downward pad contacts the first upward pad, and a side surface of the second semiconductor chip overlies the first upward pad.

DETAILED DESCRIPTION

Figure 1:
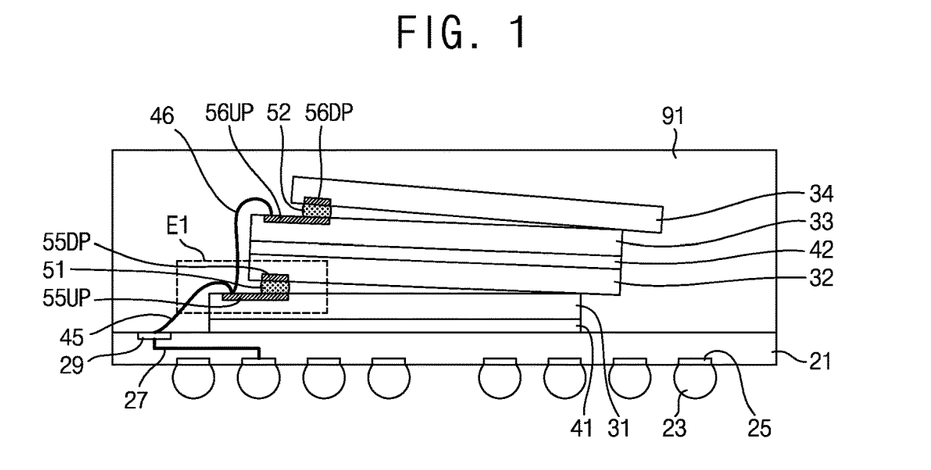
FIG. 1 is a cross-sectional view of an example of a semiconductor package according to the present inventive concept.
Figure 2:
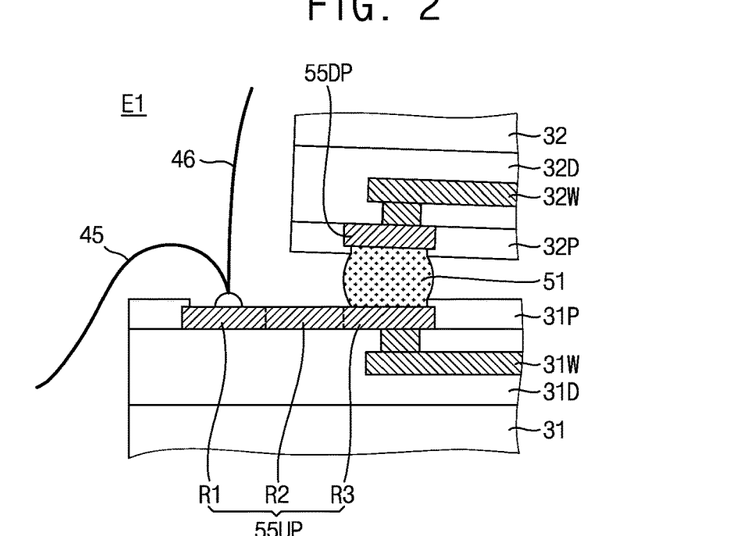
FIG. 2 is an enlarged view showing portion E1 of FIG. 1 in detail.

FIGS. 1 and 2 illustrate an example of a semiconductor package according to the present inventive concept.

Referring to FIG. 1, the semiconductor package may include a substrate 21, a plurality of protruding electrodes 23, a plurality of outer terminals 25, an internal interconnection 27, an inner terminal 29, a plurality of semiconductor chips 31, 32, 33, and 34, a plurality of adhesives 41 and 42, a plurality of bonding wires 45 and 46, a plurality of inter-chip connectors 51 and 52, a plurality of upward pads 55UP and 56UP, a plurality of downward pads 55DP and 56DP, and an encapsulant 91. For reference only, the semiconductor chips 31, 32, 33, and 34 will be referred to as a first semiconductor chip 31, a second semiconductor chip 32, a third semiconductor chip 33, and a fourth semiconductor chip 34. The adhesives 41 and 42 will be referred to as a first adhesive 41 and a second adhesive 42. The bonding wires 45 and 46 will be referred to as a first bonding wire 45 and a second bonding wire 46. The inter-chip connectors 51 and 52 will be referred to as a first inter-chip connector 51 and a second inter-chip connector 52. The upward pads 55UP and 56UP will be referred to as a first upward pad 55UP and a second upward pad 56UP. The downward pads 55DP and 56DP will be referred to as a first downward pad 55DP and a second downward pad 56DP.

The substrate 21 may include a rigid printed circuit board, a flexible printed circuit board, a rigid-flexible printed circuit board, or a combination thereof. The substrate 21 may be a multi-layer circuit board. The plurality of outer terminals 25 may be disposed on a lower surface of the substrate 21, and the inner terminal 29 may be disposed on an upper surface of the substrate 21. The inner terminal 29 may be electrically connected to one of the outer terminals 25 via the internal interconnection 27 in the substrate 21. The plurality of protruding electrodes 23 may be formed on the plurality of outer terminals 25.

The plurality of protruding electrodes 23 may include solder balls, conductive bumps, conductive pins, conductive leads, or combinations thereof. The plurality of outer terminals 25, the internal interconnection 27, and the inner terminal 29 may include metals, conductive carbon, or combinations thereof. For example, the plurality of outer terminals 25, the internal interconnection 27, and the inner terminal 29 may include copper (Cu). In one example of the semiconductor package according to the inventive concept, the plurality of outer terminals 25 and the plurality of protruding electrodes 23 are omitted. The inner terminal 29 may be a bond finger.

The plurality of semiconductor chips 31, 32, 33, and 34 may include a volatile memory, a non-volatile memory, a microprocessor, an application processor, a controller, an image sensor, or a combination thereof. Some of the semiconductor chips 31, 32, 33, and 34 may have different sizes from one another, but a case in which the semiconductor chips 31, 32, 33, and 34 have the same size will be described below for convenience of description. Here, the term "size" refers to the footprint of the chip, i.e., the area of the chip as viewed in a plan view of the chip.

The first semiconductor chip 31 may be disposed on the substrate 21. The first adhesive 41 may be interposed between and attach the first semiconductor chip 31 and the substrate 21. The first upward pad 55UP may be disposed on an upper surface of the first semiconductor chip 31. The first bonding wire 45 may connect the first upward pad 55UP and the inner terminal 29.

The second semiconductor chip 32 may be arranged as disposed on and offset relative to the first semiconductor chip 31. That is, the second semiconductor chip 32 may be disposed on the first semiconductor chip 31 with a geometric center of the second semiconductor chip 32 laterally deviating a certain distance relative to that the first semiconductor chip 31 as viewed in a cross-sectional view of the stack of semiconductor chips 31, 32, etc. A side surface of the second semiconductor chip 32 may be arranged above the first upward pad 55UP. The first downward pad 55DP may thus lie over a lower surface of the second semiconductor chip 32. The first inter-chip connector 51 may be formed between the first downward pad 55DP and the first upward pad 55UP. The farther inward from the first inter-chip connector 51, the closer to the upper surface of the first semiconductor chip 31 the lower surface of the second semiconductor chip 32 may be. The lower surface of the second semiconductor chip 32 may be in contact with one edge of the first semiconductor chip 31. The second semiconductor chip 32 may be stacked at an incline on the first semiconductor chip 31. In an example, the farther inward from the first inter-chip connector 51, the smaller a gap between the first semiconductor chip 31 and the second semiconductor chip 32 may be. The gap between the first semiconductor chip 31 and the second semiconductor chip 32 may be defined to be the shortest distance from one point on the upper surface of the first semiconductor chip 31 to the second semiconductor chip 32.

The third semiconductor chip 33 may be disposed on the second semiconductor chip 32. The second adhesive 42 may be interposed between and attach the third semiconductor chip 33 and the second semiconductor chip 32. The second upward pad 56UP may be disposed on an upper surface of the third semiconductor chip 33. The second bonding wire 46 may connect the second upward pad 56UP and the first upward pad 55UP. A side surface(s) of the third semiconductor chip 33 may be substantially coplanar with a side surface(s) of the second semiconductor chip 32.

The fourth semiconductor chip 34 may be arranged with an offset above the third semiconductor chip 33. A side surface of the fourth semiconductor chip 34 may be arranged above the second upward pad 56UP. The second downward pad 56DP may be disposed on a lower surface of the fourth semiconductor chip 34. The second inter-chip connector 52 may be formed between the second downward pad 56DP and the second upward pad 56UP. The farther inward from the second inter-chip connector 52, the closer to the upper surface of the third semiconductor chip 33 the lower surface of the fourth semiconductor chip 34 may be. The lower surface of the fourth semiconductor chip 34 may be in contact with one edge of the third semiconductor chip 33.

The encapsulant 91, which covers the plurality of semiconductor chips 31, 32, 33, and 34 and the plurality of bonding wires 45 and 46, may be formed on the substrate 21. The encapsulant 91 may include an epoxy molding compound (EMC). The plurality of adhesives 41 and 42 may include die attach films (DAFs). The plurality of bonding wires 45 and 46 may include Au, Al, Cu, Ag, or a combination thereof. The plurality of inter-chip connectors 51 and 52 may include conductive bumps, solder balls, conductive pins, or combinations thereof. The plurality of upward pads 55UP and 56UP and the plurality of downward pads 55DP and 56DP may include Cu, Co, Al, Sn, Ni, Au, Ag, W, Ti, TiN, Ta, TaN, Ru, Pt, or a combination thereof.

The first semiconductor chip 31 may be the lowermost semiconductor chip in the package, and the fourth semiconductor chip 34 may be the uppermost semiconductor chip. The second bonding wire 46 may be formed at a lower level than an upper surface of the fourth semiconductor chip 34. The encapsulant 91 may cover the upper surface of the fourth semiconductor chip 34. A thickness of the encapsulant 91 may be determined by the upper surface of the fourth semiconductor chip 34. The encapsulant 91 may surround side surfaces of the first semiconductor chip 31 and the fourth semiconductor chip 34. The width of the encapsulant 91 may be determined by widths of the first semiconductor chip 31 and the fourth semiconductor chip 34. The thickness and width of the encapsulant 91 may be efficiently reduced.

Referring to FIG. 2, a first interlayer insulating layer 31D may form (the upper) part of the first semiconductor chip 31. A first internal circuit 31W of the first semiconductor chip 31 may be formed in the first interlayer insulating layer 31D. A first protective layer 31P of the first semiconductor chip 31 may be formed on the first interlayer insulating layer 31D. The first upward pad 55UP may be formed in the first protective layer 31P and thus may be considered as disposed at an upper surface of the first semiconductor chip 31. The first protective layer 31P may cover edges of the first upward pad 55UP. The first upward pad 55UP may be connected to the first internal circuit 31W. A second interlayer insulating layer 32D may form (the lower) part of the second semiconductor chip 32. A second internal circuit 32W, i.e., the IC of the second semiconductor chip 32, may be disposed in the second interlayer insulating layer 32D. A second protective layer 32P of the second semiconductor chip 32 may be disposed under the second interlayer insulating layer 32D. The first downward pad 55DP may be formed in the second protective layer 32P and thus may be considered as disposed at a lower surface of the second semiconductor chip 32. The second protective layer 32P may cover edges of the first downward pad 55DP. The first downward pad 55DP may be connected to the second internal circuit 32W.

The first upward pad 55UP may have a first region R1, a second region R2, and a third region R3. The second region R2 may be disposed between the first region R1 and the third region R3. The first inter-chip connector 51 may be disposed between the third region R3 and the first downward pad 55DP. The first inter-chip connector 51 may be in contact with the third region R3 and the first downward pad 55DP. The plurality of bonding wires 45 and 46 may be connected to the first upward pad 55UP at the first region R1. That is, one end of the first bonding wire 45 may be in contact with the first region R1, and one end of the second bonding wire 46 may be in contact with the first region R1. The side surface of the second semiconductor chip 32 may be arranged between the first region R1 and the third region R3. The side surface of the second semiconductor chip 32 may overlie the second region R2. A lower edge of the side surface of the second semiconductor chip 32 may overly the second region R2 of the first upward pad 55UP of the first semiconductor chip 31. This structural arrangement is present at the uppermost one of the semiconductor chips in the stack and the semiconductor chip on which the uppermost one of the semiconductor chips is directly stacked, i.e., a lower edge of the side surface of the fourth semiconductor chip 34 in the example of FIG. 1 overlies the second region R2 of the upward pad 56UP of the third semiconductor chip 33. In this way, no bonding wire is require to extend to the upper surface of the uppermost one of the semiconductor chips, namely, the fourth semiconductor chip 34 in this example.

The size of the first upward pad 55UP may be determined by the first inter-chip connector 51, the plurality of bonding wires 45 and 46, and a distance between the side surface of the second semiconductor chip 32 and the first downward pad 55DP. The first region R1 may be larger than a diameter of the plurality of bonding wires 45 and 46. The third region R3 may be larger than a diameter of the first inter-chip connector 51. A length of the second region R2 may be greater than the distance between the side surface of the second semiconductor chip 32 and the first downward pad 55DP.

The first interlayer insulating layer 31D, the second interlayer insulating layer 32D, the first protective layer 31P, and the second protective layer 32P may include silicon oxide, silicon nitride, silicon oxynitride, or a combination thereof. The first internal circuit 31W and the second internal circuit 32W may include a metal, a metal nitride, a metal oxide, a metal silicide, polysilicon, a doped semiconductor layer, conductive carbon, or a combination thereof.

FIGS. 3 to 6 illustrate different examples of the pads that may be employed by the semiconductor package of FIG. 1, especially as an upward pad. As the descriptions below make clear, the pad is an electrical connector provided at a surface of a semiconductor chip.

Figure 3:
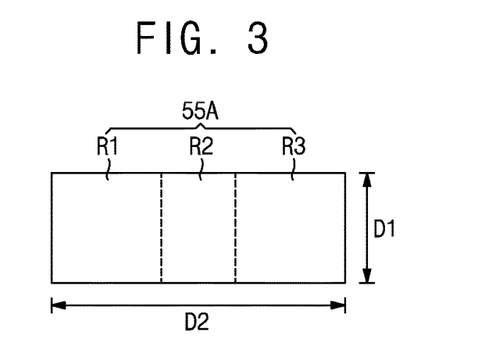
FIGS. 3, 4, 5, and 6 are diagrams of layouts of different examples of pads of the semiconductor package of FIG. 1.

Referring to FIG. 3, a pad 55A may have a first region R1, a second region R2, and a third region R3. The second region R2 may be interposed between the first region R1 and the third region R3. The second region R2 may be contiguous with the first to third regions R1 to R3. A short side of the pad 55A may have a first length D1. A long side of the pad 55A may have a second length D2. The second length D2 may be two to five times the first length D1. In an example, the second length D2 is about three times the first length D1.

In an example, the first region R1 is larger than a surface in contact with the plurality of bonding wires 45 and 46. The third region R3 is larger than a surface in contact with the first inter-chip connector 51. A length of the second region R2 is greater than the distance between the side surface of the second semiconductor chip 32 and the first downward pad 55DP. The second length D2 of the pad 55A may be minimized as much as possible for reducing weight, thickness, length, and size.

Figure 4:
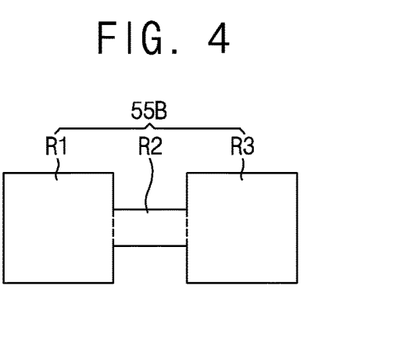

Referring to FIG. 4, a pad 55B may have a first region R1, a second region R2, and a third region R3. The second region R2 may have a smaller width than the first region R1 and the third region R3. The second region R2 may serve to electrically connect the first region R1 and the third region R3. The second region R2 may be variously modified for convenience in a manufacturing process such as a loading effect.

Figure 5:
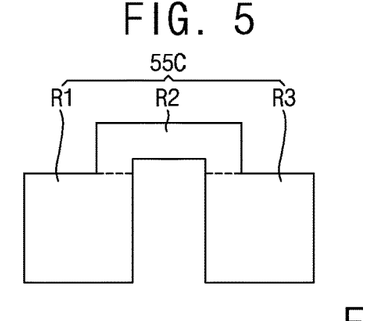

Referring to FIG. 5, a pad 55C may have a first region R1, a second region R2, and a third region R3. The second region R2 may be disposed to bypass side surfaces of the first region R1 and the third region R3. The second region R2 may be considered as a bypass interconnection. The second region R2 may be variously modified in consideration of an arrangement of adjacent components.

Figure 6:
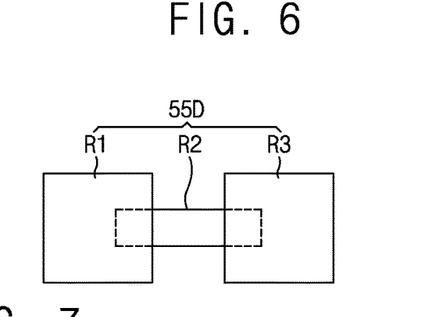

Referring to FIG. 6, a pad 55D may have a first region R1, a second region R2, and a third region R3. The second region R2 may be disposed at a different level than the first region R1 and the third region R3. For example, the second region R2 may be disposed at a lower level than the first region R1 and the third region R3. In consideration of an arrangement of adjacent components, the second region R2 may be disposed at various levels in a bypassing manner.

The various pads 55A, 55B, 55C, and 55D described with reference to FIGS. 3 to 6 may be selectively used as the plurality of upward pads 55UP and 56UP and the plurality of downward pads 55DP and 56DP. In an example of a semiconductor package according to the inventive concept, the plurality of upward pads 55UP and 56UP each have the form of the pad 55A.

FIGS. 7 to 18 illustrate other examples of semiconductor packages according to the present inventive concept.

Figure 7:
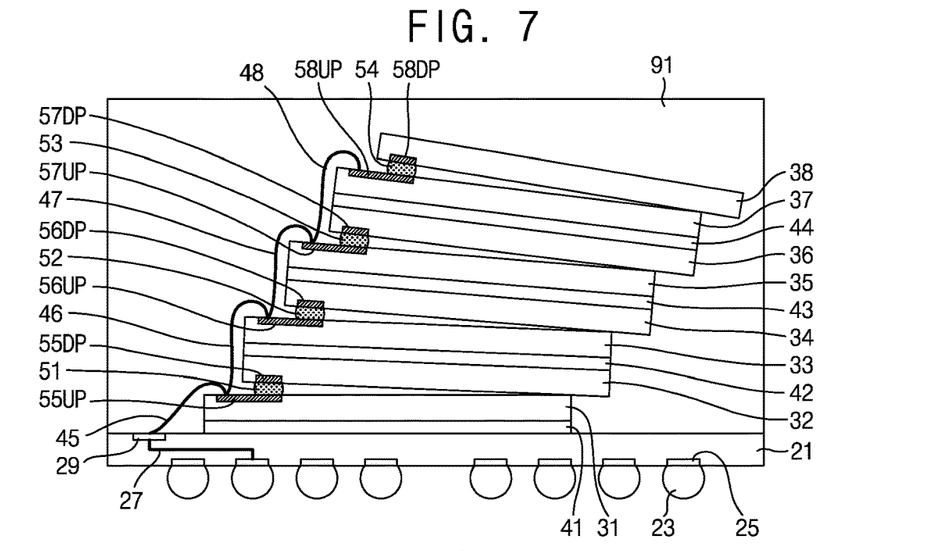
FIGS. 7, 8, 9, 10, 11, 12, 13, 14, 15, 16, 17 and 18 are cross-sectional views of examples of semiconductor packages according to the present inventive concept.

Referring to FIG. 7, a semiconductor package according to the inventive concept may include a substrate 21, a plurality of protruding electrodes 23, a plurality of outer terminals 25, an internal interconnection 27, an inner terminal 29, a plurality of semiconductor chips 31, 32, 33, 34, 35, 36, 37, and 38, a plurality of adhesives 41, 42, 43, and 44, a plurality of bonding wires 45, 46, 47, and 48, a plurality of inter-chip connectors 51, 52, 53, and 54, a plurality of upward pads 55UP, 56UP, 57UP, and 58UP, a plurality of downward pads 55DP, 56DP, 57DP, and 58DP, and an encapsulant 91.

For reference only, the semiconductor chips 31, 32, 33, 34, 35, 36, 37, and 38 will be referred to as a first semiconductor chip 31, a second semiconductor chip 32, a third semiconductor chip 33, a fourth semiconductor chip 34, a fifth semiconductor chip 35, a sixth semiconductor chip 36, a seventh semiconductor chip 37, and an eighth semiconductor chip 38. The adhesives 41, 42, 43, and 44 will be referred to as a first adhesive 41, a second adhesive 42, a third adhesive 43, and a fourth adhesive 44. The bonding wires 45, 46, 47, and 48 will be referred to as a first bonding wire 45, a second bonding wire 46, a third bonding wire 47, and a fourth bonding wire 48. The inter-chip connectors 51, 52, 54, and 54 will be referred to as a first inter-chip connector 51, a second inter-chip connector 52, a third inter-chip connector 53, and a fourth inter-chip connector 54. The upward pads 55UP, 56UP, 57UP, and 58UP will be referred to as a first upward pad 55UP, a second upward pad 56UP, a third upward pad 57UP, and a fourth upward pad 58UP. The downward pads 55DP, 56DP, 57DP, and 58DP will be referred to as a first downward pad 55DP, a second downward pad 56DP, a third downward pad 57DP, and a fourth downward pad 58DP.

The fifth semiconductor chip 35 may be disposed on the fourth semiconductor chip 34. The third adhesive 43 may be interposed between and attach the fifth semiconductor chip 35 and the fourth semiconductor chip 34. The third upward pad 57UP may be disposed on an upper surface of the fifth semiconductor chip 35. The third bonding wire 47 may connect the third upward pad 57UP and the second upward pad 56UP. A side surface(s) of the fifth semiconductor chip 35 may be substantially coplanar with a side surface(s) of the fourth semiconductor chip 34.

The sixth semiconductor chip 36 may be arranged with an offset above the fifth semiconductor chip 35. A side surface of the sixth semiconductor chip 36 may be arranged above the third upward pad 57UP. The third downward pad 57DP may be disposed on a lower surface of the sixth semiconductor chip 36. The third inter-chip connector 53 may be interposed between the third downward pad 57DP and the third upward pad 57UP. The farther inward from the third inter-chip connector 53, the closer to the upper surface of the fifth semiconductor chip 35 the lower surface of the sixth semiconductor chip 36 may be. The lower surface of the sixth semiconductor chip 36 may be in contact with one edge of the fifth semiconductor chip 35.

The seventh semiconductor chip 37 may be disposed on the sixth semiconductor chip 36. The fourth adhesive 44 may be interposed between and attach the seventh semiconductor chip 37 and the sixth semiconductor chip 36. The fourth upward pad 58UP may be disposed on an upper surface of the seventh semiconductor chip 37. The fourth bonding wire 48 may connect the fourth upward pad 58UP and the third upward pad 57UP. A side surface(s) of the seventh semiconductor chip 37 may be substantially coplanar with the side surface(s) of the sixth semiconductor chip 36.

The eighth semiconductor chip 38 may be arranged with an offset above the seventh semiconductor chip 37. A side surface of the eighth semiconductor chip 38 may be arranged above the fourth upward pad 58UP. The fourth downward pad 58DP may be disposed on a lower surface of the eighth semiconductor chip 38. The fourth inter-chip connector 54 may be interposed between the fourth downward pad 58DP and the fourth upward pad 58UP. The farther inward from the fourth inter-chip connector 54, the closer to the upper surface of the seventh semiconductor chip 37 the lower surface of the eighth semiconductor chip 38 may be. The lower surface of the eighth semiconductor chip 38 may be in contact with one edge of the seventh semiconductor chip 37.

Figure 8:
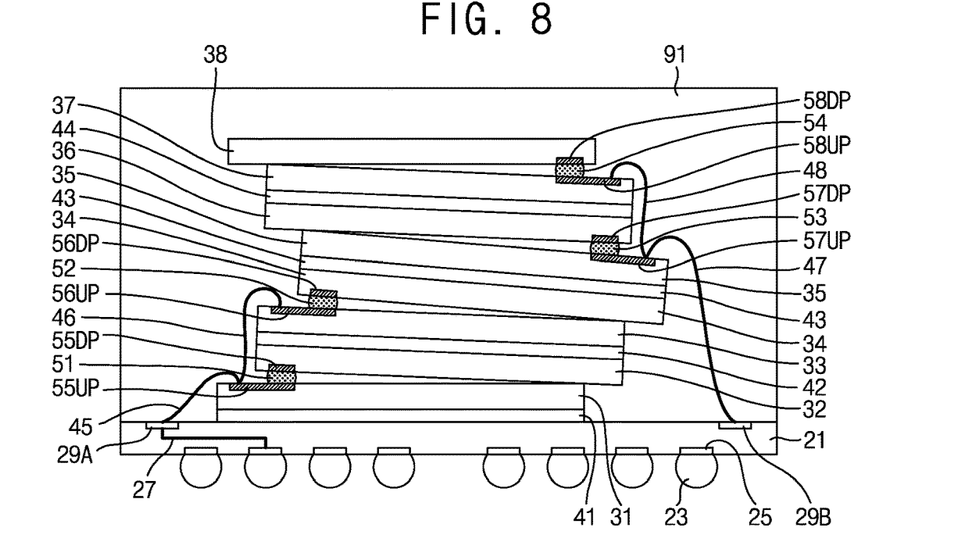

Referring to FIG. 8, a semiconductor package according to the inventive concept may have a plurality of inner terminals 29A and 29B disposed on an upper surface of a substrate 21. For reference only, the inner terminals 29A and 29B will be referred to as a first inner terminal 29A and a second inner terminal 29B. A third upward pad 57UP may be disposed on an upper surface of a fifth semiconductor chip 35. The third upward pad 57UP may be disposed adjacent to an edge that is relatively far from a second downward pad 56DP between two opposite edges of the fifth semiconductor chip 35. A third bonding wire 47 may connect the third upward pad 57UP and the second inner terminal 29B.

Figure 9:
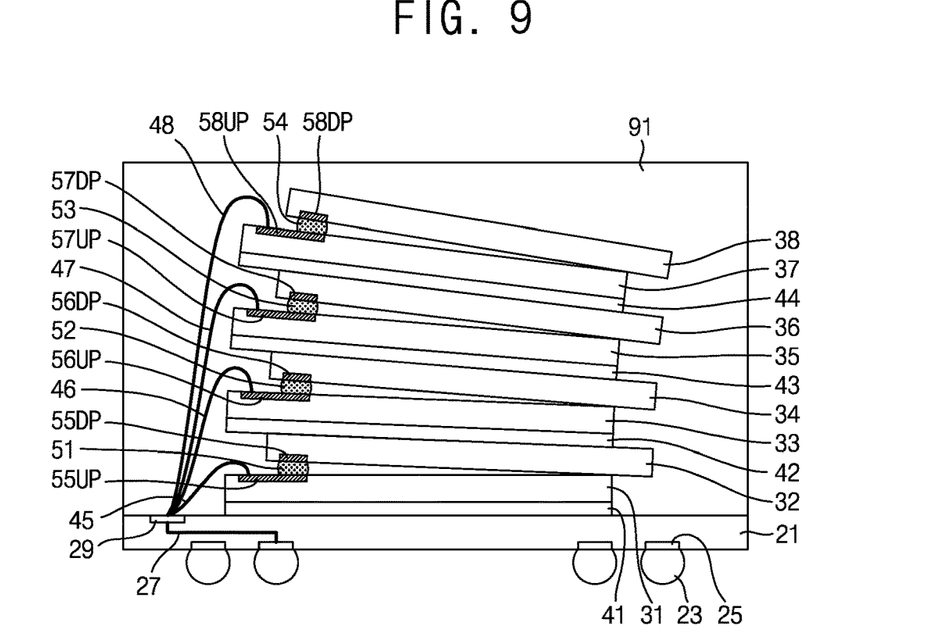

Referring to FIG. 9, in a semiconductor package according to the inventive concept a side surface of a third semiconductor chip 33 may be arranged above a side surface of a first semiconductor chip 31. The side surface of the third semiconductor chip 33 may be laterally offset from a side surface of a second semiconductor chip 32. A side surface of a fifth semiconductor chip 35 may be arranged above the side surface of the third semiconductor chip 33. A side surface of a seventh semiconductor chip 37 may be arranged above the side surface of the fifth semiconductor chip 35. A second bonding wire 46 may connect a second upward pad 56UP and an inner terminal 29. A third bonding wire 47 may connect a third upward pad 57UP and the inner terminal 29. A fourth bonding wire 48 may connect a fourth upward pad 58UP and the inner terminal 29.

Figure 10:
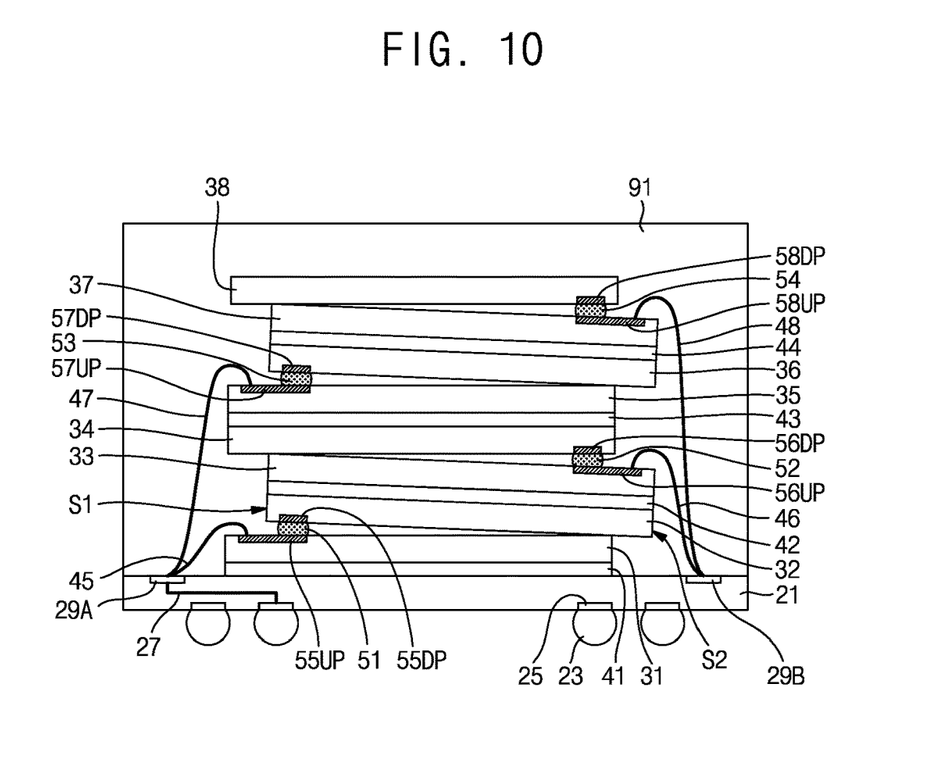

Referring to FIG. 10, in a semiconductor package according to the inventive concept a second semiconductor chip 32 may include a first side surface S1 and a second side surface S2 opposite to the first side surface S1. The first side surface S1 may be proximate (relatively close) a first downward pad 55DP, and the second side surface S2 may be remote (relatively far) from the first downward pad 55DP. A second upward pad 56UP may be disposed on an upper surface of a third semiconductor chip 33. The second upward pad 56UP may be disposed adjacent to the second side surface S2. A second bonding wire 46 may connect the second upward pad 56UP and a second inner terminal 29B.

A third upward pad 57UP may be disposed on an upper surface of a fifth semiconductor chip 35. The third upward pad 57UP may be disposed adjacent to an edge that is remote from a second downward pad 56DP between two opposite edges of the fifth semiconductor chip 35. A third bonding wire 47 may connect the third upward pad 57UP and a first inner terminal 29A. A fourth upward pad 58UP may be disposed on an upper surface of a seventh semiconductor chip 37. The fourth upward pad 58UP may be disposed adjacent to an edge that is remote from a third downward pad 57DP between two opposite edges of the seventh semiconductor chip 37. A fourth bonding wire 48 may connect the fourth upward pad 58UP and the second inner terminal 29B.

Figure 11:
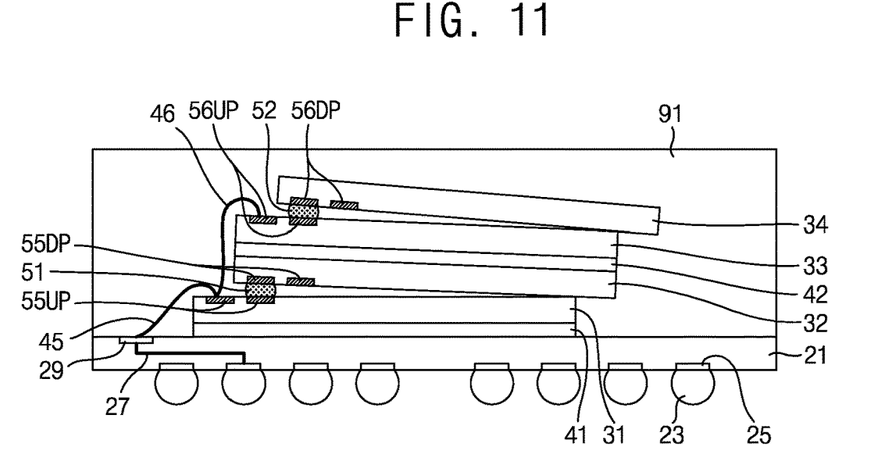

Referring to FIG. 11, in a semiconductor package according to the inventive concept a plurality of downward pads 55DP and 56 DP may be configured similarly to a plurality of upward pads 55UP and 56UP. The plurality of downward pads 55DP and 56DP and the plurality of upward pads 55UP and 56UP may be in the form of any of the various pads 55A, 55B, 55C, and 55D described with reference to FIGS. 3 to 6. For example, the plurality of downward pads 55DP and 56DP and the plurality of upward pads 55UP and 56UP may each be similar to the pad 55C.

Figure 12:
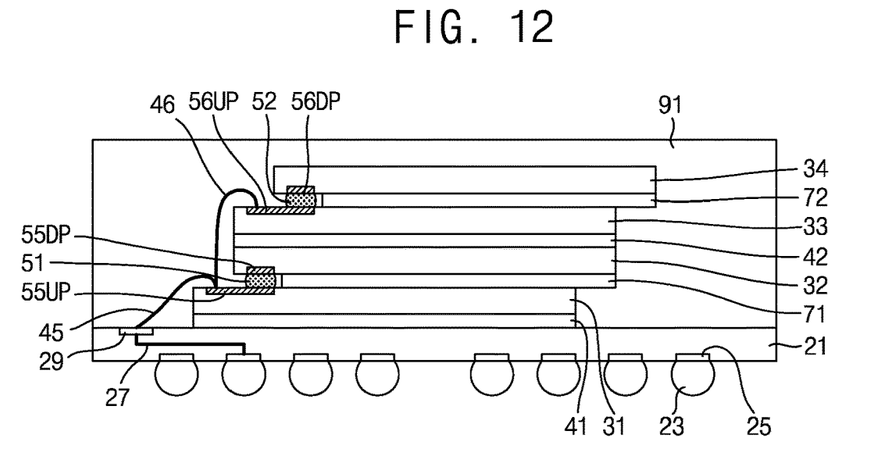

Referring to FIG. 12, a semiconductor package according to the inventive concept may include a first film spacer 71 interposed between a first semiconductor chip 31 and a second semiconductor chip 32. The first film spacer 71 may have substantially the same thickness as a first inter-chip connector 51. A second film spacer 72 may be interposed between a third semiconductor chip 33 and a fourth semiconductor chip 34. The second film spacer 72 may have substantially the same thickness as a second inter-chip connector 52. The first film spacer 71 and the second film spacer 72 may include DAFs.

Figure 13:
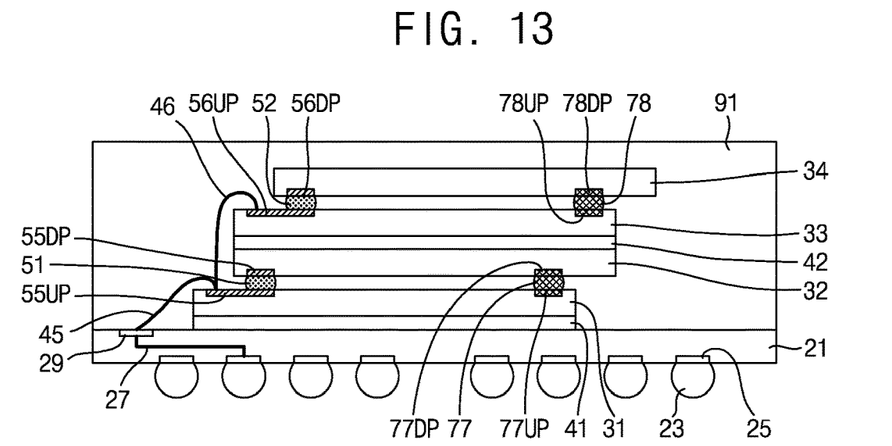

Referring to FIG. 13, a semiconductor package according to the inventive concept may include a first bump spacer 77 interposed between a first semiconductor chip 31 and a second semiconductor chip 32. The first bump spacer 77 may have substantially the same thickness as a first inter-chip connector 51. The first bump spacer 77 may be of the same material as the first inter-chip connector 51, and simultaneously formed therewith. A first upward dummy pad 77UP may be disposed on an upper surface of the first semiconductor chip 31. A first downward dummy pad 77DN may be disposed on a lower surface of the second semiconductor chip 32. The first bump spacer 77 may be interposed between the first upward dummy pad 77UP and the first downward dummy pad 77DP.

A second bump spacer 78 may be interposed between a third semiconductor chip 33 and a fourth semiconductor chip 34. The first bump spacer 77 and the second bump spacer 78 may have the form of bumps. The second bump spacer 78 may have substantially the same thickness as a second inter-chip connector 52. The second bump spacer 78 may be of the same material as the second inter-chip connector 52, and simultaneously formed therewith. A second upward dummy pad 78UP may be disposed on an upper surface of the third semiconductor chip 33. A second downward dummy pad 78DN may be disposed on a lower surface of the fourth semiconductor chip 34. The second bump spacer 78 may be interposed between the second upward dummy pad 78UP and the second downward dummy pad 78DP.

Figure 14:
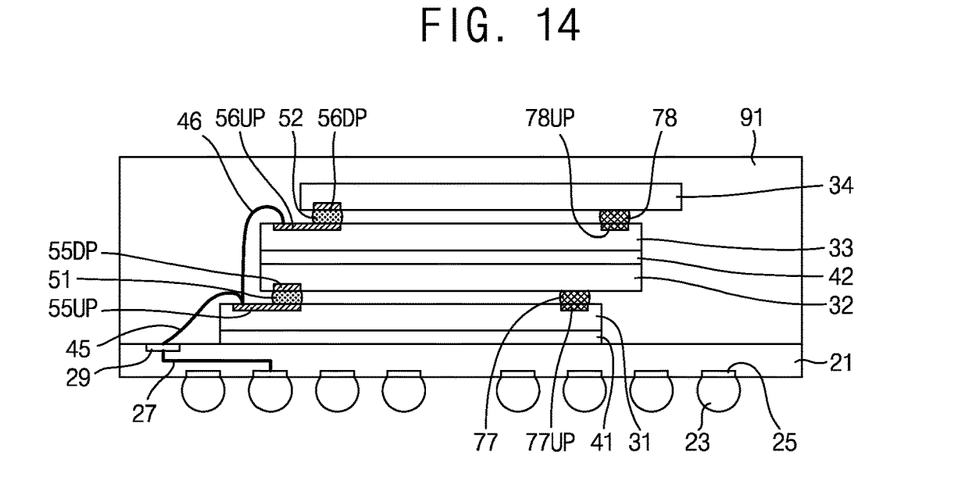

Referring to FIG. 14, a semiconductor package according to the inventive concept may include a first upward dummy pad 77UP disposed on an upper surface of a first semiconductor chip 31. A first bump spacer 77 may be in contact with the first upward dummy pad 77UP. A second upward dummy pad 78UP may be disposed on an upper surface of a third semiconductor chip 33. A second bump spacer 78 may be in contact with the second upward dummy pad 78UP.

Figure 15:
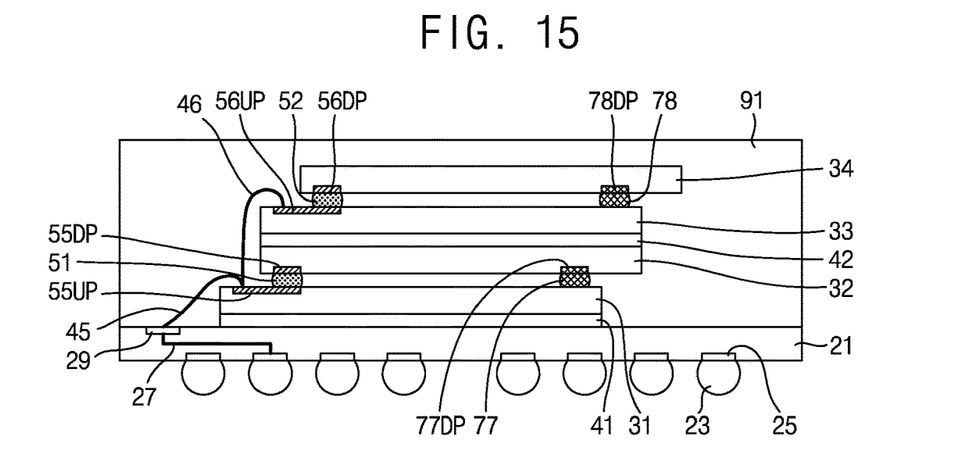

Referring to FIG. 15, a semiconductor package according to the inventive concept may include a first downward dummy pad 77DP disposed on a lower surface of a second semiconductor chip 32. A first bump spacer 77 may be in contact with the first downward dummy pad 77DP. A second downward dummy pad 78DP may be disposed on a lower surface of a fourth semiconductor chip 34. A second bump spacer 78 may be in contact with the second downward dummy pad 78DP.

Figure 16:
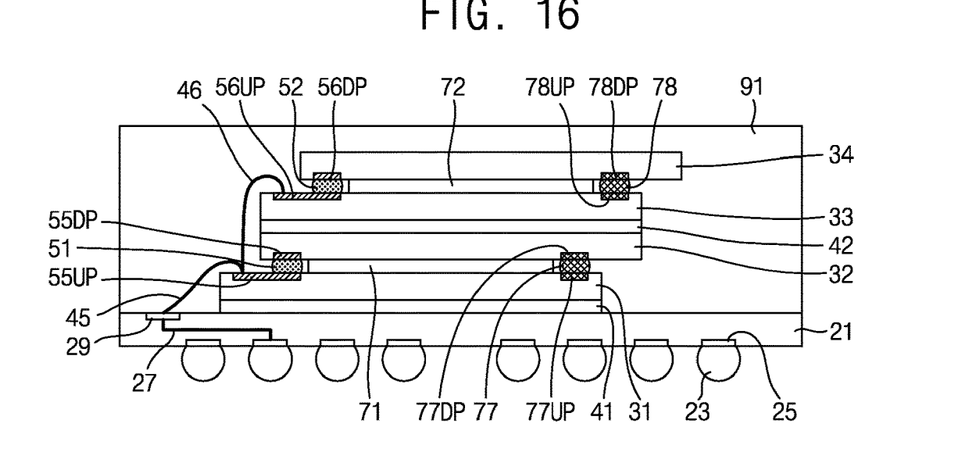

Referring to FIG. 16, a semiconductor package according to the inventive concept may include a plurality of film spacers 71 and 72, a plurality of bump spacers 77 and 78, a plurality of upward dummy pads 77UP and 78UP, and a plurality of downward dummy pads 77DP and 78DP. The plurality of film spacers 71 and 72 and the plurality of bump spacers 77 and 78 may be referred to generally as spacers. Select ones of the spacers 71, 72, 77, and 78 may be selectively omitted. The spacers 71, 72, 77, and 78 may include DAFs, bumps, or combinations thereof.

Figure 17:
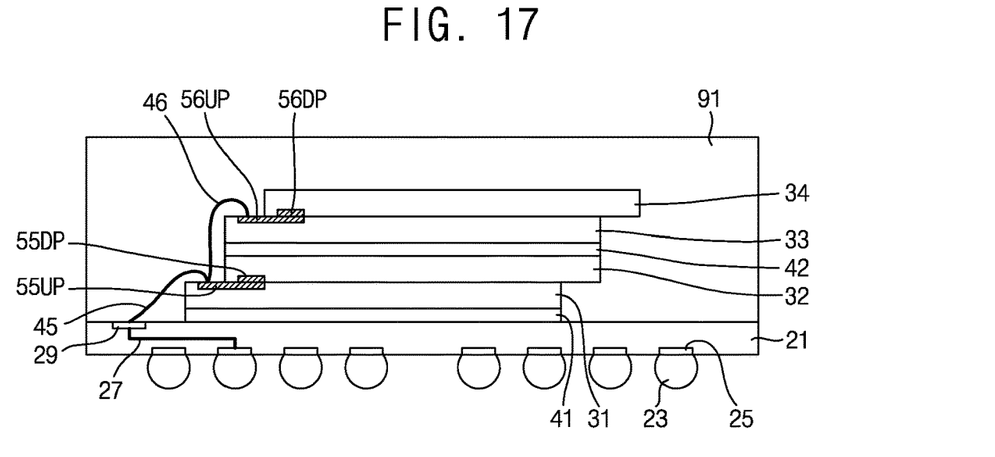

Referring to FIG. 17, a semiconductor package according to the inventive concept may include a plurality of semiconductor chips 31, 32, 33, and 34, a plurality of adhesives 41 and 42, a plurality of bonding wires 45 and 46, a plurality of inter-chip connectors 51 and 52, a plurality of upward pads 55UP and 56UP, and a plurality of downward pads 55DP and 56DP. The plurality of downward pads 55DP and 56DP may have a structure different from that of the plurality of upward pads 55UP and 56UP.

The second semiconductor chip 32 may be directly bonded to the first semiconductor chip 31. The first downward pad 55DP may contact the first upward pad 55UP. An interface between the first upward pad 55UP and the first downward pad 55DP may be substantially coplanar with an interface between the first semiconductor chip 31 and the second semiconductor chip 32. The fourth semiconductor chip 34 may be directly bonded to the third semiconductor chip 33. The second downward pad 56DP may contact a part of the second upward pad 56UP. An interface between the second upward pad 56UP and the second downward pad 56DP may be substantially coplanar with an interface between the third semiconductor chip 33 and the fourth semiconductor chip 34.

Figure 18:
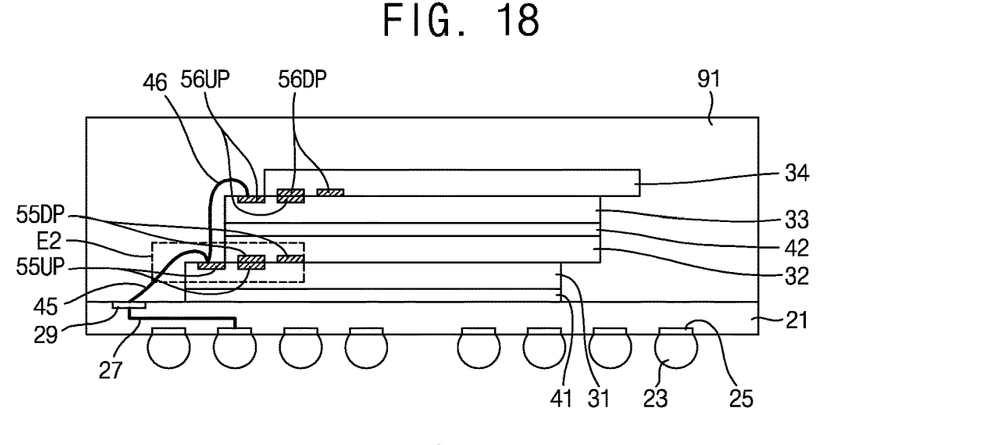
Figure 19:
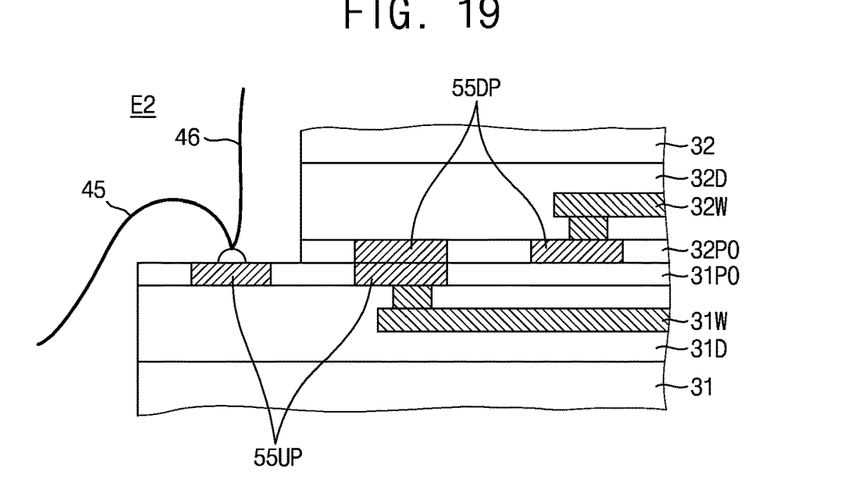
FIG. 19 is an enlarged view showing portion E2 of FIG. 18 in detail.

Referring to FIGS. 18 and 19, in a semiconductor package according to the inventive concept, downward pads 55DP and 56DP may have substantially the same structure as that of upward pads 55UP and 56UP.

Referring to FIG. 19, a first protective layer 31PO may be formed on a first interlayer insulating layer 31D. A first upward pad 55UP may be formed in the first protective layer 31PO. Upper surfaces of the first protective layer 31PO and the first upward pad 55UP may be substantially coplanar. A second protective layer 32PO may be disposed under a second interlayer insulating layer 32D. A first downward pad 55DP may be formed in the second protective layer 32PO. Lower surfaces of the second protective layer 32PO and the first downward pad 55DP may be substantially coplanar.

The first protective layer 31PO and the second protective layer 32PO may include an insulating layer such as silicon oxide. The second protective layer 32PO may be directly bonded to the first protective layer 31PO. The first downward pad 55DP may contact the first upward pad 55UP. An interface between the first upward pad 55UP and the first downward pad 55DP may be substantially coplanar with an interface between the first protective layer 31PO and the second protective layer 32PO.

In this example of a semiconductor package according to the inventive concept, the second semiconductor chip 32 may be considered as being bonded directly to a first semiconductor chip 31. The first upward pad 55UP and the first downward pad 55DP may have a structure similar to that of any of the various pads 55A, 55B, 55C, and 55D described with reference to FIGS. 3 to 6. The first upward pad 55UP and the first downward pad 55DP may have different structures.

Note, it will be readily apparent to those of ordinary skill in the art that the semiconductor packages described with reference to FIGS. 7 to 10 may be modified or adapted to employ various characterizing features of the semiconductor packages described with reference to FIGS. 11 to 19, within the scope of the inventive concept.

According to the present inventive concept, a plurality of semiconductor chips form a stacked structure on a substrate, and include a second semiconductor chip arranged on and with a lateral offset relative a first semiconductor chip. A downward pad disposed on a lower surface of the second semiconductor chip is connected to an upward pad disposed on an upper surface of the first semiconductor chip. A side surface of the second semiconductor chip is arranged above the upward pad. A bonding wire connects the upward pad and the substrate. The second semiconductor chip is connected to the substrate via the downward pad, the upward pad, and the bonding wire. The length of signal transmission path of the second semiconductor chip may thus be minimized. The bonding wire may be confined to a level beneath that of an upper surface of the second semiconductor chip. An encapsulant may cover the plurality of semiconductor chips and the bonding wire. A thickness of the encapsulant may be determined by the upper surface of the uppermost semiconductor chip. The volume of the encapsulant may be effectively kept to a minimum. Thus, a semiconductor package according to the inventive concept is advantageous in providing a high operating speed within a minimal amount of space.

Although examples of the present inventive concept have been described in detail with reference to the accompanying drawings, those of ordinary skill in the art to which the present inventive concept pertains will appreciate that the present inventive concept may be implemented in other concrete forms without departing from the technical spirit and essential features thereof. Thus, the above-described examples should be regarded as exemplary of the inventive concept rather than limiting.

What is claimed is:

1. A semiconductor package comprising:
   a package substrate;
   a first semiconductor chip on the package substrate, the first semiconductor chip having an upper surface and a first upward pad disposed on the upper surface of the first semiconductor chip;
   a second semiconductor chip disposed on the first semiconductor chip, the first semiconductor chip laterally offset relative to the second semiconductor chip, and the second semiconductor chip having a lower surface and a first downward pad disposed on the lower surface of the second semiconductor chip;
   a first bonding wire extending between and electrically connecting the first upward pad and the package substrate; and
   a first inter-chip connector interposed between the first upward pad and the first downward pad,
   wherein a side surface of the second semiconductor chip overlies the first upward pad, and
   wherein the first upward pad includes a planar upper surface connected to both the first bonding wire and the first inter-chip connector.

2. The semiconductor package of claim 1, wherein:
   the first upward pad has a first region, a second region, and a third region;
   the second region is disposed between the first region and the third region; and
   the side surface of the second semiconductor chip overlies the second region of the first upward pad.

3. The semiconductor package of claim 2, wherein:
   the first bonding wire contacts the first region of the first upward pad; and
   the first inter-chip connector contacts the third region of the first upward pad.

4. The semiconductor package of claim 1, wherein the first upward pad has a length two to five times its width.

5. The semiconductor package of claim 1, wherein the first inter-chip connector includes at least one element selected from the group consisting of a conductive bump, a solder ball, and a conductive pin.

6. The semiconductor package of claim 1, wherein a gap between the first semiconductor chip and the second semiconductor chip decreases in an inward direction away from the first inter-chip connector.

7. The semiconductor package of claim 1, further comprising a spacer between the first semiconductor chip and the second semiconductor chip,
   wherein the spacer includes at least one of a die attach film (DAF) and a bump.

8. The semiconductor package of claim 1, further comprising:
   a third semiconductor chip disposed on the second semiconductor chip, the third semiconductor chip having an upper surface and a second upward pad disposed on the upper surface of the third semiconductor chip; and
   a second bonding wire contacting the second upward pad.

9. The semiconductor package of claim 8, wherein a side surface of the third semiconductor chip is substantially coplanar with the side surface of the second semiconductor chip.

10. The semiconductor package of claim 8, wherein the second semiconductor chip has a first side surface disposed adjacent to the first downward pad, and a second side surface opposite to the first side surface, and
    the second upward pad disposed on the upper surface of the third semiconductor chip is adjacent to the second side surface.

11. The semiconductor package of claim 8, wherein a side surface of the third semiconductor chip overlies a side surface of the first semiconductor chip and is laterally offset relative to the side surface of the second semiconductor chip.

12. The semiconductor package of claim 8, further comprising:
    a fourth semiconductor chip disposed on and laterally offset relative to the third semiconductor chip, the fourth semiconductor chip having a lower surface and a second downward pad disposed on the lower surface of the fourth semiconductor chip; and
    a second inter-chip connector disposed between the second upward pad and the second downward pad,
    wherein a side surface of the fourth semiconductor chip overlies the second upward pad.

13. A semiconductor package comprising:
    a package substrate;
    a first semiconductor chip on the package substrate, the first semiconductor chip having an upper surface and a first upward pad disposed on the upper surface of the first semiconductor chip;
    a second semiconductor chip disposed on and laterally offset relative to the first semiconductor chip, the second semiconductor chip having a lower surface and a first downward pad disposed on the lower surface of the second semiconductor chip; and
    a first bonding wire extending between and electrically connecting the first upward pad and the package substrate,
    wherein the first downward pad contacts the first upward pad,
    the first upward pad includes a planar upper surface connected to both the first bonding wire and the first downward pad, and a side surface of the second semiconductor chip overlies the first upward pad.

14. The semiconductor package of claim 13, wherein an interface between the first upward pad and the first downward pad is substantially coplanar with an interface between the first semiconductor chip and the second semiconductor chip.

15. The semiconductor package of claim 13, further comprising:
a third semiconductor chip disposed on the second semiconductor chip, the third semiconductor chip having an upper surface and a second upward pad disposed on the upper surface of the third semiconductor chip; and
a second bonding wire contacting the second upward pad.

16. The semiconductor package of claim 15, wherein a side surface of the third semiconductor chip is substantially coplanar with the side surface of the second semiconductor chip.

17. The semiconductor package of claim 15, further comprising:
a fourth semiconductor chip disposed on and laterally offset relative to the third semiconductor chip, the fourth semiconductor chip having a lower surface and a second downward pad disposed on the lower surface of the fourth semiconductor chip,
wherein the second downward pad contacts the second upward pad, and
a side surface of the fourth semiconductor chip overlies the second upward pad.

18. A semiconductor package comprising:
a printed circuit board;
semiconductor chips stacked one on another on the printed circuit board, the uppermost one of the semiconductor chips of the semiconductor package being disposed on a lower one of the semiconductor chips;
bonding wires electrically connecting the semiconductor chips to the printed circuit board; and
an encapsulant encapsulating the semiconductor chips and the bonding wires on the printed circuit hoard,
wherein the lower one of the semiconductor chips has an upper surface and an upward electrical connector disposed at the upper surface,
the upward electrical connector has a first region, a second region and a third region of electrically conductive material integral with one another, the second region extending between and connecting the first and third regions,
the uppermost one of the semiconductor chips of the semiconductor package has an upper surface, a side surface, a bottom surface and a downward pad of electrically conductive material at the bottom surface, a lower edge of the side surface of the uppermost one of the semiconductor chips overlying the second region of the upward electrical connector of the lower one of the semiconductor chips, and the downward pad facing and electrically connected to the upward electrical connector of the lower semiconductor chip at the third region of the upward electrical connector,
one of the bonding wires is electrically connected to the upward electrical connector of the lower one of the semiconductor chips at the first region of the upward electrical connector, whereby the uppermost one of the semiconductor chips is electrically connected to the printed circuit board through the upward electrical connector of the lower one of the semiconductor chips and said one of the bonding wires, and
the upward electrical connector includes a planar upper surface connected to both the one of the bonding wires and the downward pad.

19. The semiconductor package of claim 18, further comprising an inter-chip connector interposed between and electrically connecting the upward electrical connector of the lower one of the semiconductor chips and the downward pad of the uppermost one of the semiconductor chips.

20. The semiconductor package of claim 18, wherein the downward pad of the uppermost one of the semiconductor chips contacts the upward electrical connector of the lower one of the semiconductor chips through the third region of the upward electrical connector.

21. A semiconductor package comprising:
a package substrate;
a first semiconductor chip on the package substrate, the first semiconductor chip having an upper surface and a first upward pad disposed on the upper surface of the first semiconductor chip;
a second semiconductor chip disposed on the first semiconductor chip, the first semiconductor chip laterally offset relative to the second semiconductor chip, and the second semiconductor chip having a lower surface and a first downward pad disposed on the lower surface of the second semiconductor chip;
a first bonding wire extending between and electrically connecting the first upward pad and the package substrate;
a first inter-chip connector interposed between the first upward pad and the first downward pad;
a third semiconductor chip disposed on the second semiconductor chip, the third semiconductor chip having an upper surface and a second upward pad disposed on the upper surface of the third semiconductor chip; and
a second bonding wire contacting the second upward pad, wherein a side surface of the second semiconductor chip overlies the first upward pad.

22. A semiconductor package comprising:
a package substrate;
a first semiconductor chip on the package substrate, the first semiconductor chip having an upper surface and a first upward pad disposed on the upper surface of the first semiconductor chip;
a second semiconductor chip disposed on and laterally offset relative to the first semiconductor chip, the second semiconductor chip having a lower surface and a first downward pad disposed on the lower surface of the second semiconductor chip;
a first bonding wire extending between and electrically connecting the first upward pad and the package substrate;
a third semiconductor chip disposed on the second semiconductor chip, the third semiconductor chip having an upper surface and a second upward pad disposed on the upper surface of the third semiconductor chip; and
a second bonding wire contacting the second upward pad, wherein the first downward pad contacts the first upward pad, and
a side surface of the second semiconductor chip overlies the first upward pad.

* * * * *